United States Patent
Benedetto

(10) Patent No.: US 6,452,263 B1
(45) Date of Patent: Sep. 17, 2002

(54) RADIATION SHIELD AND RADIATION SHIELDED INTEGRATED CIRCUIT DEVICE

(75) Inventor: Joseph Benedetto, Monument, CO (US)

(73) Assignee: Aeroflex UTMC Microelectronic Systems, Inc., Colorado Springs, CO (US)

(*) Notice: Subject to any disclaimer, the term of this patent is extended or adjusted under 35 U.S.C. 154(b) by 0 days.

(21) Appl. No.: 09/715,401

(22) Filed: Nov. 17, 2000

Related U.S. Application Data

(60) Provisional application No. 60/167,182, filed on Nov. 23, 1999.

(51) Int. Cl.$^7$ .......................... H01L 23/06; H01L 23/10
(52) U.S. Cl. ........................ 257/703; 257/685; 257/678
(58) Field of Search .................................. 257/703, 678, 257/685, 686, 704, 659

(56) References Cited

U.S. PATENT DOCUMENTS

| | | | |
|---|---|---|---|
| 5,406,117 A | 4/1995 | Dlugokecki et al. | 257/659 |
| 5,635,754 A | 6/1997 | Strobel et al. | 257/659 |
| 5,825,042 A | 10/1998 | Strobel et al. | 250/515.1 |
| 5,880,403 A * | 3/1999 | Czajkowski et al. | 174/35 R |
| 5,889,316 A | 3/1999 | Strobel et al. | 257/659 |
| 5,998,867 A | 12/1999 | Jensen et al. | 257/729 |
| 6,261,508 B1 * | 7/2001 | Featherby et al. | 264/408 |
| 6,262,362 B1 * | 7/2001 | Czajkowski et al. | 174/35 R |
| 6,319,740 B1 * | 11/2001 | Heffner et al. | 438/26 |

* cited by examiner

Primary Examiner—Richard Elms
Assistant Examiner—Brad Smith
(74) Attorney, Agent, or Firm—Morgan & Finnegan, LLP

(57) ABSTRACT

A radiation shielded integrated circuit device comprises an integrated circuit die and a first layer of shielding material supporting the integrated circuit die. The first layer has a central portion having a first thickness having an area at least as large as the area of the IC die, and an outer portion having a second thickness less than the first thickness. A wall of ceramic material has a first edge connected to the outer portion of the first layer of shielding material. The wall of ceramic material has an inner surface defining, in conjunction with the first layer of shielding material, a well containing the integrated circuit die. A plurality of wire bond pads are supported by the inner surface of the ceramic wall. A plurality of input/output pads are connected to an exterior surface of the ceramic walls. Conducting material extending through the ceramic material connects each of the wire bond pads to a respective one of input/output pads. Wire bands connect the integrated circuit die to the wire band pads. A second layer of shielding material is connected to a second edge of the ceramic wall. A radiation shield is also disclosed.

22 Claims, 3 Drawing Sheets

RADIATION SHIELD AND RADIATION SHIELDED INTEGRATED CIRCUIT DEVICE

This application claims the benefit of provisional patent application Ser. No. 60/167,182, filed on Nov. 23, 1999, which is incorporated by reference, herein.

FIELD OF THE INVENTION

The present invention relates to radiation shielding for an integrated circuit die.

BACKGROUND OF THE INVENTION

Electrons trapped in high earth orbits and electrons and protons trapped in low and medium earth orbits cause a high level of ionizing radiation in space. Such ionizing radiation causes an accumulation of charge in electronic circuits which eventually results in a malfunction or failure of the circuits.

Shielding is commonly provided to protect radiation sensitive components. Currently, flat slabs of high-Z metal or layers of high-Z and low-Z metals are attached to either the top or top and bottom of electronics packages for shielding. The high Z metals, such as tungsten/copper alloys, absorb ionizing radiation, such as protons and electrons, and reemit the energy from such radiation in the more innocuous forms of light, some heat, and secondary electrons. Secondary electrons have a very short range and are mostly absorbed by high-Z metals, as well. The low Z materials, such as aluminum, also absorb secondary electrons, and can improve the efficiency of the shield. However, such configurations do not sufficiently protect sensitive electronics from radiation entering from the sides of the device, where no shielding material is present.

Shielding material is also used to encapsulate the integrated circuit die. Connections are provided within the shield from the integrated circuit die to package leads extending through insulated feedthroughs through the shielding material, for electronic interconnection. The shield encapsulating the integrated circuit die must be hermetically sealed. See, example, U.S. Pat. No. 5,635,754. While usually providing better radiation protection, such devices are complex and expensive to manufacture. The additional shielding material also provides additional weight, which is a concern for electronics to be used in space. Launch costs for a satellite are about $10,000 per pound.

Another method for protecting sensitive electronics is to design a radiation tolerant integrated circuit die that can withstand high levels of ionizing radiation. These design methodologies can involve redundancy of electronic circuits, suitable doping of the semiconductor material, and spacing of electronic circuits. These methodologies are not normally used in commercially available electronics and require increased cost for redesign and production.

SUMMARY OF THE INVENTION

One embodiment of the present invention is a radiation shield comprising high Z material and having a central section with a first thickness and an outer section with a second thickness. The second thickness is less than the first thickness. The central section may support or be aligned with an integrated circuit die. The central, thicker portion is dimensioned to absorb ionizing radiation directed perpendicular to the external surface of the shield. The outer portion is dimensioned to dissipate ionizing radiation impinging on outer portions of the external surface of the radiation shield at an angle which may enable the radiation to impact an integrated circuit die or other such target. Since this ionizing radiation travels through the shielding material at an angle, it travels a greater distance through the shielding material than radiation directly on the external surface of the shield. The ionizing radiation can therefore be sufficiently absorbed, despite the lesser thickness.

In accordance with another embodiment of the invention, a radiation shielded integrated circuit device comprises an integrated circuit die and a first layer of shielding material supporting the integrated circuit die. The first layer has a central portion having a first thickness having an area at least as large as the area of the IC die, and an outer portion having a second thickness less than the first thickness. A wall of ceramic material has a first edge connected to the outer portion of the first layer of shielding material. The wall of ceramic material has an inner surface defining, in conjunction with the first layer of shielding material, a well containing the integrated circuit die. A plurality of wire bond pads are supported by the inner surface of the ceramic wall. A plurality of input/output pads are connected to an exterior surface of the ceramic walls. Conducting material extending through the ceramic material connects each of the wire bond pads to a respective one of input/output pads. Wire bands connect the integrated circuit die to the wire band pads. A second layer of shielding material is connected to a second edge of the ceramic wall.

DETAILED DESCRIPTION OF THE INVENTION

Figure 1:
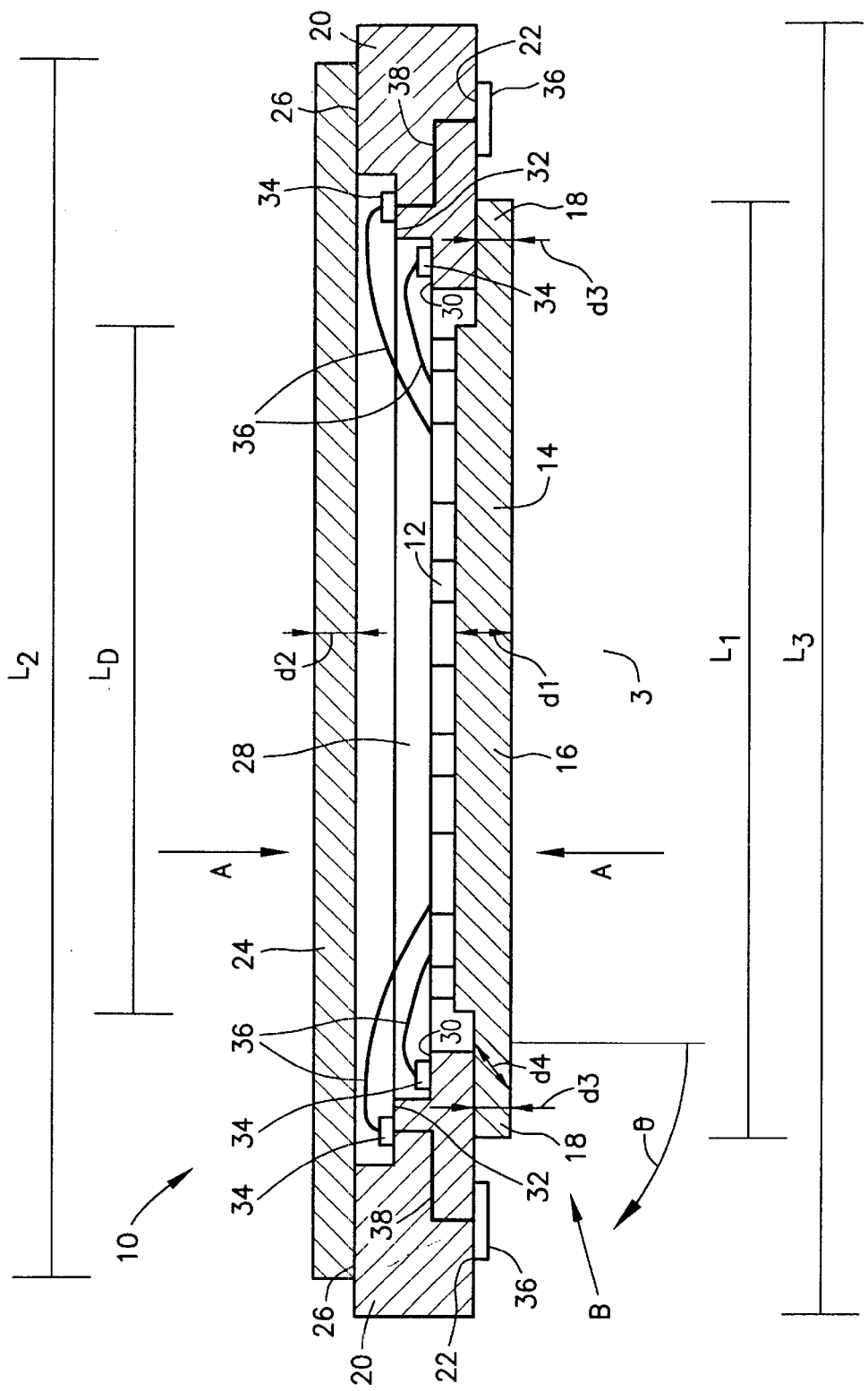
FIG. 1 is a cross-sectional view of one embodiment of the radiation shielded integrated circuit device of the present invention.

FIG. 1 is a cross-sectional view of one embodiment of a radiation shielded integrated circuit device 10 for an integrated circuit ("IC") die 12. The IC die 12, which includes the silicon substrate and the IC components providing the functionality of the circuit, is attached to a first layer 14 of shielding material, through epoxy. The first layer includes a thick, central portion 16 supporting the IC die 12, and thinner, outer portion 18 outside of the area supporting the IC die 12, surrounding the central portion 16. The area of the central portion 16 is at least as large as the area of the IC die 12. Preferably, the area of the central portion 16 is larger than the area of the IC die 12, and the IC die 12 is centered within that area. For a typical IC die having a thickness of about 10 thousandths of an inch, it is preferred that the length and width of the central portion each be about 1.4 times the corresponding length and width of the IC die.

The package includes a side wall 20 of ceramic material with a first edge 22 connected to the outer side section 18 of the first layer 14 of shielding material through epoxy, solder or braze. A copper sliver alloy may be used to braze the components together, for example. The side wall 20 and first layer of shielding material 14 define a well region 28.

The ceramic may be 94% alumina, for example. BA-914 and HA-921, available from Nippon Technical Ceramics, a subsidiary of NGK Spark Plugs Co., Inc., Japan, are suitable ceramic materials. Suitable ceramic material is also available from Kyocera Corporation, Japan.

A second layer 24 of shielding material is attached to the second edge 26 of the ceramic side wall 20 through epoxy, solder or a braze so that the IC die 12 is completely surrounded and hermetically sealed in the well region 28. A copper silver alloy may be used to braze these components together, for example.

Figure 2:
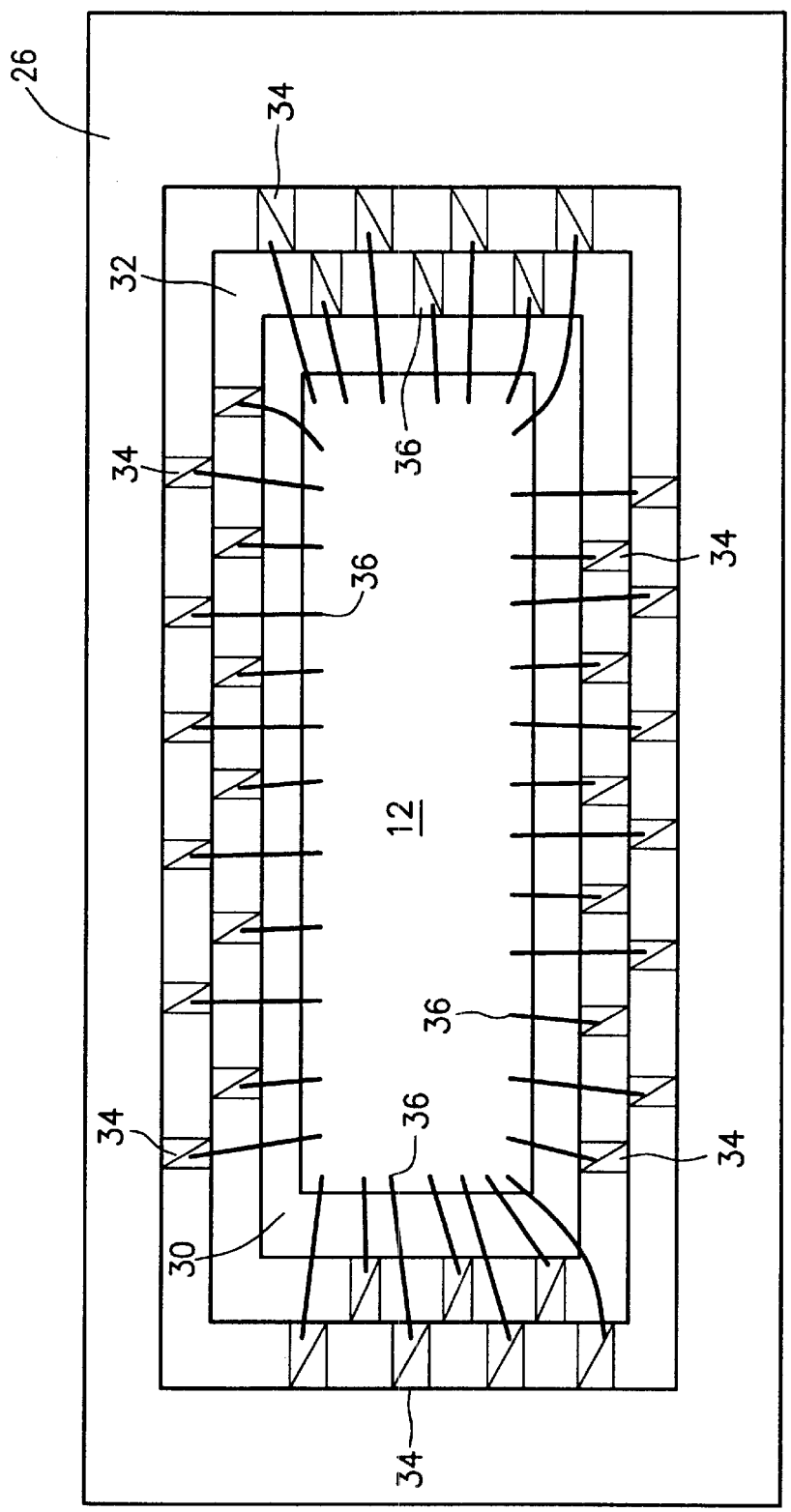
FIG. 2 is a top view of the embodiment of FIG. 1.

The surface of the ceramic wall 20 facing the well region 28 includes two ledges 30, 32. Wire bond pads 34 are located on each of the ledges 30, 32. FIG. 2 is a top view of the radiation shielded carrier 10, with the second layer 24 of shielding material removed, showing the plurality of wire bond pads 34 on the ledges 30, 32. Wire bonds 36 electrically connect the IC die 12 to the wire bond pads 34, as shown in FIGS. 1 and 2. The thicknesses of the wire bond pads 34 in FIG. 1 are exaggerated.

Input/output pads 36 are provided at the outer surface of the ceramic wall 20 for electrical connection to a socket or to lead frame containing package leads. Each wire bond pad 34 is electrically connected to an input/output pad 36 through a trace 38 of conductive material, such a tungsten. Such traces 38 of conductive material are typically formed during formation of the wall of ceramic material, in a manner known in the art. The conductive material is hermetically sealed around the trace. The wire bond pads 34 and the input/output pads 36 typically comprise nickel coated by gold.

The first and second layers of shielding material are a high Z material, preferably a copper/tungsten alloy. An alloy of approximately 90% tungsten/10% copper which has a density of about 18.31 g/cm$^3$, is preferred. Suitable alloys may be obtained from NEC Corporation, Japan and Kyocera Corporation, Japan, for example. The outer portion 18 of the first layer 14 of shielding material may be formed by machining a rectangular piece of shielding material, to reduce its thickness. The first layer of shielding material may be obtained from the manufacturers identified above, in the desired dimensions.

The thickness of the walls of the first and second layers 14, 24 is determined by the amount of shielding required in the ionizing environment. In high earth orbits (above about 8,000 kilometers), including geosynchronous orbit, 0.5 to 1.5 g/cm$^2$ of shielding material is sufficient. For low to medium earth orbits, 2 to 3 g/cm$^2$ (from about 1,000 kilometers up to about 8,000 kilometers) of shielding material is required. When the first and second layers 14, 24 comprise a 90% tungsten/10% copper alloy, these loading requirements translate to preferred thicknesses of "d1" and "d2", of about 0.026 to 0.078 cm for high earth orbits and about 0.10 to 0.16 cm for low to medium earth orbits. These thicknesses ranges are sufficient to absorb a sufficient amount of ionizing radiation impinging on the external surface of the shielding material perpendicular to the external surface, indicated by arrows A in FIG. 1, to reduce the radiation exposure of the integrated circuit die 12 to at least its intrinsic hardness. The second layer 24 of shielding material may include a thicker, central portion and an outer portion with less thickness, as well.

The length and width of the first layer 14 is sufficient such that any radiation B which could impinge on the IC die 12 at an angle is intercepted by shielding material. While the thickness d3 of the outer portion 18 of the first shielding layer 14 is less than the thickness d1 of the central portion 16, to reach the IC die 12, such ionizing radiation B must travel through the outer portion 18 of the first layer of shielding material at an angle θ. It therefore passes a greater distance through the shielding material prior to reaching the IC die 12. The outer portion 18 is dimensioned so that this greater distance d4 is at least approximately equal to the thickness d1 of the central portion 18, which is sufficient to absorb the radiation. If θ is the minimum angle along which ionizing radiation may travel to impinge on the IC die 12, then d3=d1cos θ. θ may vary dependent upon the height and width of the IC die 12 and the length of the central portion 16.

Where the length and width of the pedestal 16 are each 1.4 times greater than the corresponding length and width of the IC die 12, ionizing radiation travelling at an angle θ of 45° or greater could impinge on the IC die 12. In this case, if the thickness d3 is approximately 70% of the thickness d1, d4 will be approximately equal to d1 and the radiation will travel through a sufficient amount of shielding material to be absorbed (Cos θ=d3/d4=d3/d1).

Figure 3:
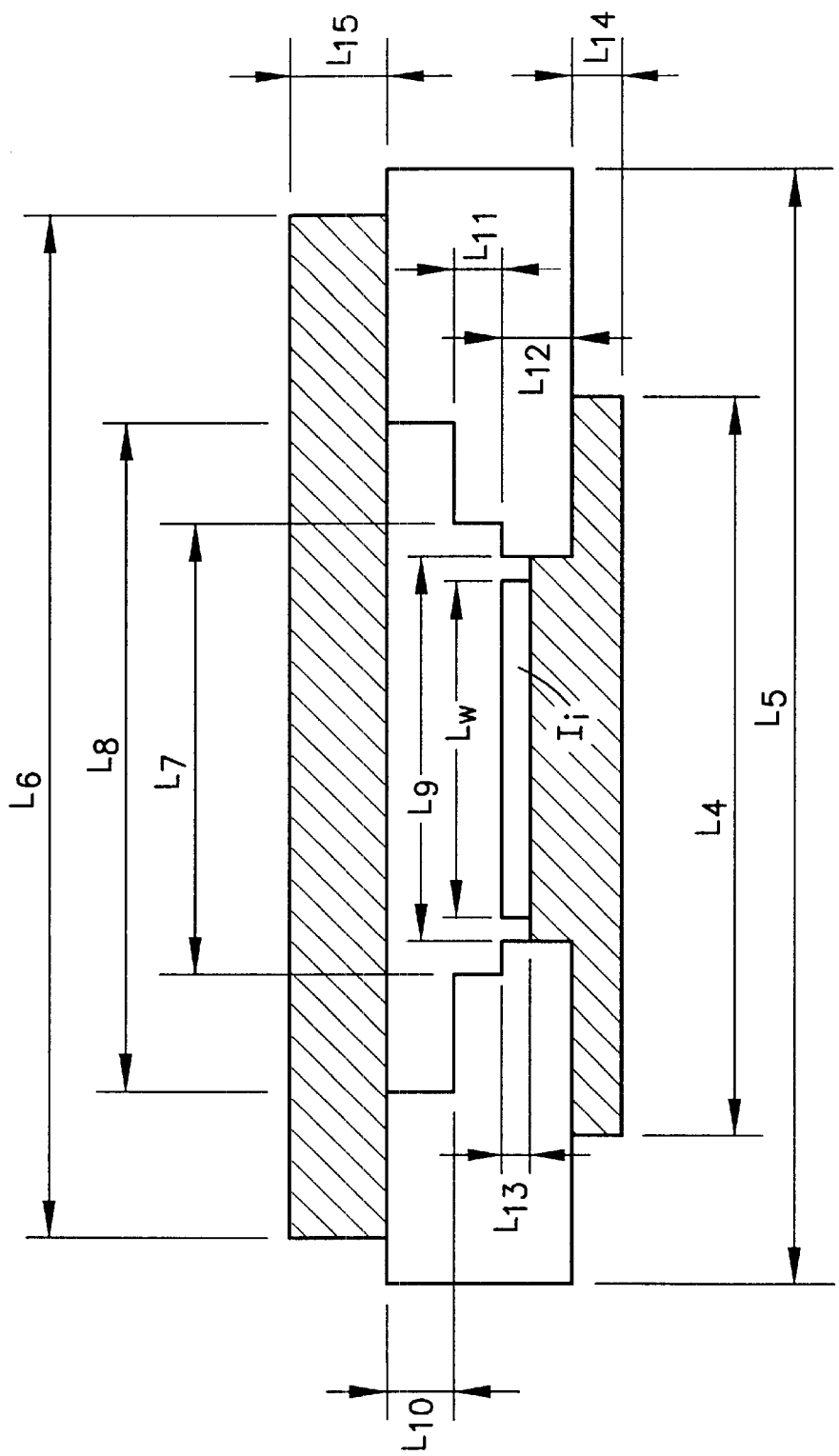
FIG. 3 is a de view of the embodiment of FIG. 1, through line 3—3 of FIG. 1.

In one example, as indicated in FIG. 1, the length $L_1$ of the first layer 14 is 0.887 inches. The length $L_2$ of the second layer 24 is 0.782. The length $L_3$ of the device 10, measured between the end walls of the side walls 20, is 0.924 inches. The length LD of the IC die 12 is 0.572 inches. FIG. 3 is a cross-sectional view through line 3—3 of FIG. 1. In FIG. 3, $L_4$ is 0.280 inches; $L_5$ is 0.380 inches; $L_6$ is 0.350 inches; $L_7$ is 0.212 inches; $L_8$ is 0.280 inches; $L_9$ 0.162 inches; $L_{10}$ is 0.020 inches; $L_{11}$ is 0.006 inches; $L_{12}$ is 0.018 inches; $L_{13}$ is 0.013 inches; $L_{14}$ is 0.040 inches; and $L_{15}$ is 0.055 inches. The width Lw of the IC die 12 is 0.264 inches. Certain portions of FIG. 1 are not shown in this view.

While the ceramic wall 20 provides some dissipation of radiation, a small amount of ionizing radiation C may reach the IC die 12. It is estimated that the IC die 12 may be exposed to approximately 5% of the radiation in the environment external to the radiation shielded carrier. At orbits above about 8,000 kilometers and below about 1,000 kilometers, typical IC dies 12 can tolerate such radiation levels.

At orbits between these levels, additional protection may need to be provided. The radiation tolerance of the integrated circuit die itself may be increased, through redundancy of electronic circuits, suitable doping of the semiconductor material and spacing of electronic circuits, for example, as is known in the art. An improved radiation tolerant circuit is disclosed in U.S. Patent Application entitled "Radiation Resistant Integrated Circuit Design", invented by Harry N. Gardner, filed on Nov. 17, 2000 (Attorney Docket No. 3707-4003 US1) and U.S. Ser. No. 60/166,072, filed on Nov. 19, 2000), which are assigned to the assignee of the present invention and incorporated by reference, herein.

By reducing the amount of shielding material at the outer portion of the first layer 17 shielding material, which is outside of the area directly supporting the IC die 12, weight can be reduced without exposing the IC die to significant amounts of ionizing radiation.

The first layer 14 of shielding material, with its thicker central portion 16 and thinner, outer portion 18, may be used as a radiation shield in other configurations, as well. The first layer 14, itself is therefore, another embodiment of the present invention.

The above embodiments are examples of a radiation shield and a radiation shielded integrated circuit device of the present invention. It is understood that variations may be introduced without departing from the scope of the invention, which is defined in the claims below.

I claim:

1. A radiation shielded integrated circuit device comprising:
   an integrated circuit die;
   a first layer of shielding material supporting the integrated circuit die, the first layer having a central portion having a first thickness and having an area at least as large as the area of the IC die, and an outer portion having a second thickness less than the first thickness;
   a wall of ceramic material having a first edge connected to the outer portion of the first layer of shielding material and a second edge, the wall of ceramic material having an inner surface defining, in conjunction with the first layer of shielding material, a well containing the integrated circuit die;
   a plurality of wire bond pads supported by the inner surface of the ceramic wall; a plurality of input/output pads connected to an exterior surface of the ceramic walls;
   conducting material extending through the ceramic material, connecting each of the wire bond pads to a respective one of input/output pads;
   wire bonds connecting the integrated circuit die to the wire bond pads; and
   a second layer of shielding material connected to the second edge of the ceramic wall.

2. The radiation shielded integrated circuit device of claim 1, wherein the shielding material comprises a high Z material.

3. The radiation shielded integrated circuit device of claim 2, wherein the shielding material comprises a copper tungsten alloy.

4. The radiation shielded integrated circuit device of claim 1, wherein the first and second layers of shielding material are connected to respective edges of the ceramic wall through an epoxy, a solder or a braze, hermetically sealing the well.

5. The radiation shielded integrated circuit device of claim 1, wherein the conductive active material comprises tungsten or a tungsten copper alloy.

6. The radiation shielded integrated circuit device of claim 1, wherein the second layer of shielding material has a central portion having a third thickness and an area at least as large as the area of the integrated circuit die and an outer portion having a fourth thickness less than the third thickness.

7. The radiation shielded integrated circuit device of claim 1, wherein the first thickness is sufficient to absorb a desired amount of ionizing radiation impinging on an external surface of the first layer, substantially perpendicular to the external surface.

8. The radiation shielded integrated circuit device of claim 7, wherein the second thickness of the outer portion is sufficient so that radiation must travel through the outer portion a distance at least approximately equal to the first thickness to impinge on the integrated circuit die through the outer portion.

9. The radiation shielded integrated circuit device of claim 1, wherein the second thickness of the outer portion is sufficient so that radiation must travel through the outer portion a distance at least approximately equal to the first thickness to impinge on the integrated circuit die through the outer portion.

10. The radiation shielded integrated circuit device of claim 7, wherein the second thickness is approximately equal to the first thickness multiplied by the cosine of a minimum angle, measured form a line normal to the external surface of the first layer, along which radiation can travel through the outer portion, to impinge upon the integrated circuit die.

11. The radiation shielded integrated circuit device of claim 1, wherein the second thickness is approximately equal to the first thickness multiplied by the cosine of a minimum angle, measured from a line normal to the external surface of the first layer, along which radiation can travel through the outer portion to impinge upon the integrated circuit die.

12. The radiation shielded integrated circuit package of claim 1, wherein the central portion has a length and a width about 1.4 times the corresponding length and width of the integrated circuit die.

13. A radiation shield having a central portion having a first thickness and an outer portion having a second thickness which is less than the first thickness; wherein the central and outer portions are included in a shielding material layer.

14. The radiation shield of claim 13, comprising a high Z material.

15. The radiation shield of claim 14, wherein the high Z material comprises a tungsten or tungsten copper alloy.

16. The radiation shield of claim 13, wherein the central portion is for supporting an integrated circuit die.

17. The radiation shields of claim 13, wherein the first thickness is sufficient to absorb a desired amount of ionizing radiation impinging on an external surface of the first layer, substantially perpendicular to the external surface.

18. The radiation shield of claim 17, wherein the second thickness of the outer portion is sufficient so that radiation must travel through the outer portion a distance at least approximately equal to the first thickness to impinge on the integrated circuit die through the outer portion.

19. The radiation shield of claim 13, wherein the second thickness of the outer portion is sufficient so that radiation must travel through the outer portion a distance at least approximately equal to the first thickness to impinge on the integrated circuit die through the outer portion.

20. The radiation shields of claim 19, wherein the second thickness is approximately equal to the first thickness multiplied by the cosine of a minimum angle, measured from a line normal to the external surface of the first layer, along which radiation can travel through the outer portion to impinge upon the integrated circuit die.

21. The radiation shields of claim 13, wherein the second thickness is approximately equal to the first thickness multiplied by the cosine of a minimum angle, measured from a line normal to the external surface of the first layer, along which radiation can travel through the outer portion to impinge upon the integrated circuit die.

22. The radiation shield of claim 13, wherein the central portion has a length and a width about 1.4 times the corresponding length and width of the integrated circuit die to be supported by the central portion.

* * * * *